(12) United States Patent
Wong et al.

(10) Patent No.: US 6,879,131 B2
(45) Date of Patent: Apr. 12, 2005

(54) MINIMIZING END BOUNDARY RESISTANCE IN A PROGRAMMABLE RESISTOR OF AN INTEGRATED CIRCUIT

(75) Inventors: Jhonny A. Wong, Austin, TX (US); Gexin Huang, Austin, TX (US); G. Patrick Muyshondt, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/406,956

(22) Filed: Apr. 3, 2003

(65) Prior Publication Data

US 2004/0196063 A1 Oct. 7, 2004

(51) Int. Cl.[7] ............................................. H01M 10/46
(52) U.S. Cl. ...................... 320/128; 327/538; 327/540; 326/30
(58) Field of Search ............................ 326/30; 327/538, 327/540, 541, 561, 562; 320/116, 118, 119, 128, 134, 136, 137

(56) References Cited

U.S. PATENT DOCUMENTS 6,424,121 B1 * 7/2002 Khouri et al. ............... 320/128
6,650,173 B1 * 11/2003 Khouri et al. ............... 327/538
6,738,173 B2 * 5/2004 Bonthron et al. ............ 359/238

* cited by examiner

Primary Examiner—Vibol Tan
(74) Attorney, Agent, or Firm—Hamilton & Terrile, LLP; Kent B. Chambers

(57) ABSTRACT

A programmable resistor includes a variety of taps. Selection of any of a variety of tap combinations establishes a path through which current will flow, thus, setting the resistance value of the programmable resistor. The programmable resistor minimizes the effects of parasitic end boundary resistances, $R_{end}/w$, between contacts and resistive areas by limiting the contribution of the end boundary resistances to $2R_{end}/w$, regardless of the programmed tap combination. By fabricating a contiguous region of impedance material, only the $R_{end}/w$ end boundary resistances associated with selected taps affect the value of the programmed resistance. A notched tap structure provides predictability of the resistance value of each tap combination. Taps are narrowed to form a notch which establishes a well-defined current flow path, thus providing the resistance predictability. Additionally, notches also allow for a wider contact-resistive area end boundary, thus, further minimizing the parasitic effect of $R_{end}$.

44 Claims, 4 Drawing Sheets

MINIMIZING END BOUNDARY RESISTANCE IN A PROGRAMMABLE RESISTOR OF AN INTEGRATED CIRCUIT

BACKGROUND OF THE INVENTION

Field of the Invention

The present invention relates in general to the field of integrated circuits, and more specifically to a system and method for minimizing end boundary resistance in programmable resistors of an integrated circuit.

DESCRIPTION OF THE RELATED ART

Integrated circuits use programmable resistors to fine tune resistances for semiconductor devices. Typically, designers utilize computer programs to simulate integrated circuit functionality prior to fabrication. Sometimes integrated circuit fabrication produces functional variations that do not match simulations. Programmable resistors are used to offset the fabrication variations and conform actual fabricated integrated circuits with design simulations. To achieve a high degree of conformance, designers attempt to use programmable resistors with minimum resistance increments. For example, setting and calibrating a bias point can require programmable resistor increments on the order of 100 ohms.

FIG. 1 depicts a top view of a conventional programmable resistor, fabricated in a semiconductor substrate and sometimes referred to as a "meander resistor". The meander resistor 100 includes 6 taps, A through F, connected to respective metal layers 101A–101F. Salicide contacts 102a–102j connect metal layers 101A–101F to respective primary resistive areas 104AB, 104BC, 104CD, 104DE, and 104EF extending between each tap and having respective length and width dimensions of "L" and "w". Resistive areas 104AB–104EF are, for example, a p+ diffusion area or non-salicide polysilicon resistor. A salicide deposition blocking layer 104 preserves the relatively high resistance (compared to a salicide) of resistive areas 104AB–104EF. "$R_{sq} \cdot (L/w)$" defines the resistance of resistive areas 104AB–104EF, where "$R_{sq}$" represents the unit area resistance. An inherent parasitic resistance $R_{end}/w$ exists at each end boundary region between a salicide contact 102X and a resistive area 104Y, where "X" represents a corresponding contact to a resistive area "Y" and "$R_{end}$" represents a unit area resistance. $A_1, B_1, B_2, \ldots, F_1$ identify end boundary regions. The value of resistance $R_{end}$ is inversely proportional to the width, w, of the end boundary region.

The meander resistor 100 is programmed by selecting the beginning and end taps through which current will flow. For example, by selecting taps A and C, current will flow from tap A, across metal 101A, contact 102a, end boundary $A_1$, resistive area 104AB, end boundary $B_1$, contact 102b, metal 101B, contact 102c, end boundary $B_2$, resistive area 104BC, end boundary $C_1$, contact 102d, metal 101C, to tap C. For many semiconductor structures, the end boundary resistance $R_{end}/w$ between each contact 102X and resistive area 104Y is approximately equal to $R_{sq} \cdot (L/w)$. Thus, the parasitic resistance $R_{end}/w$ in a meander resistor 100 contributes approximately twice the amount of resistance of the resistive areas 104Y for each tap combination. For example, programming a resistance configuration of $R_{AF}$ (i.e. selecting taps A and F) results in an approximate resistance $R_{AF} = 5R_{sq} \cdot (L/w) + 10R_{end}/w$. The large contribution of $R_{end}/w$ to the overall resistance of a meander resistor 100 disadvantageously limits the granularity of achievable resistance values. For example, if $R_{sq} \cdot (L/w) = R_{end}/w = 100$ ohms, the granularity of meander resistor 100 is limited to increments of 300 ohms. This level of granularity is often not ideal when fine tuning semiconductor devices such as voltage controlled oscillators.

SUMMARY OF THE INVENTION

In one embodiment of the present invention, an apparatus having a programmable impedance includes an electrical current impedance material. The apparatus further includes multiple selectable connections to the impedance material, wherein an end boundary impedance is associated with a boundary between each connection and the impedance material and only the end boundary impedances associated with selected connections contribute a non-negligible impedance to a programmed impedance value of the programmable impedance for at least two programmable combinations of impedances.

In another embodiment of the present invention, an integrated circuit having a programmable resistor includes a homogenous resistive material. The integrated circuit also includes at least three connections to the resistive material, wherein an end boundary resistance is associated with a boundary between each connection and the impedance material and only the end boundary resistances associated with selected connections contribute to programmed resistance value of the programmable resistor.

In another embodiment of the present invention, a method of manufacturing programmable resistors of an integrated circuit includes creating an electrical current impedance material in a semiconductor substrate. The method further includes creating multiple selectable connections to the impedance material, wherein an end boundary resistance is associated with a boundary between each connection and the impedance material and only the end boundary resistances associated with selected connections contribute a non-negligible impedance to a programmed impedance value of the programmable impedance for at least two programmable combinations of resistances.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Although the present invention has been described in detail, it should be understood that various changes, substitutions and alterations can be made hereto without departing from the spirit and scope of the invention as defined by the appended claims.

Integrated circuits utilize programmable resistors to fine tune resistance values associated with a variety of electronic devices, including voltage controlled oscillators, microprocessors, digital signal processing circuits, mixed analog and digital circuits, and analog circuits. Fine tuning resistance values is particularly important to high performance electronics, such as high performance audio systems. In many circumstances, programmable resistance configurations having small incremental resistance values provide a higher level of resistance granularity that improves resistance tuning and, thus, circuit performance.

Figure 1:
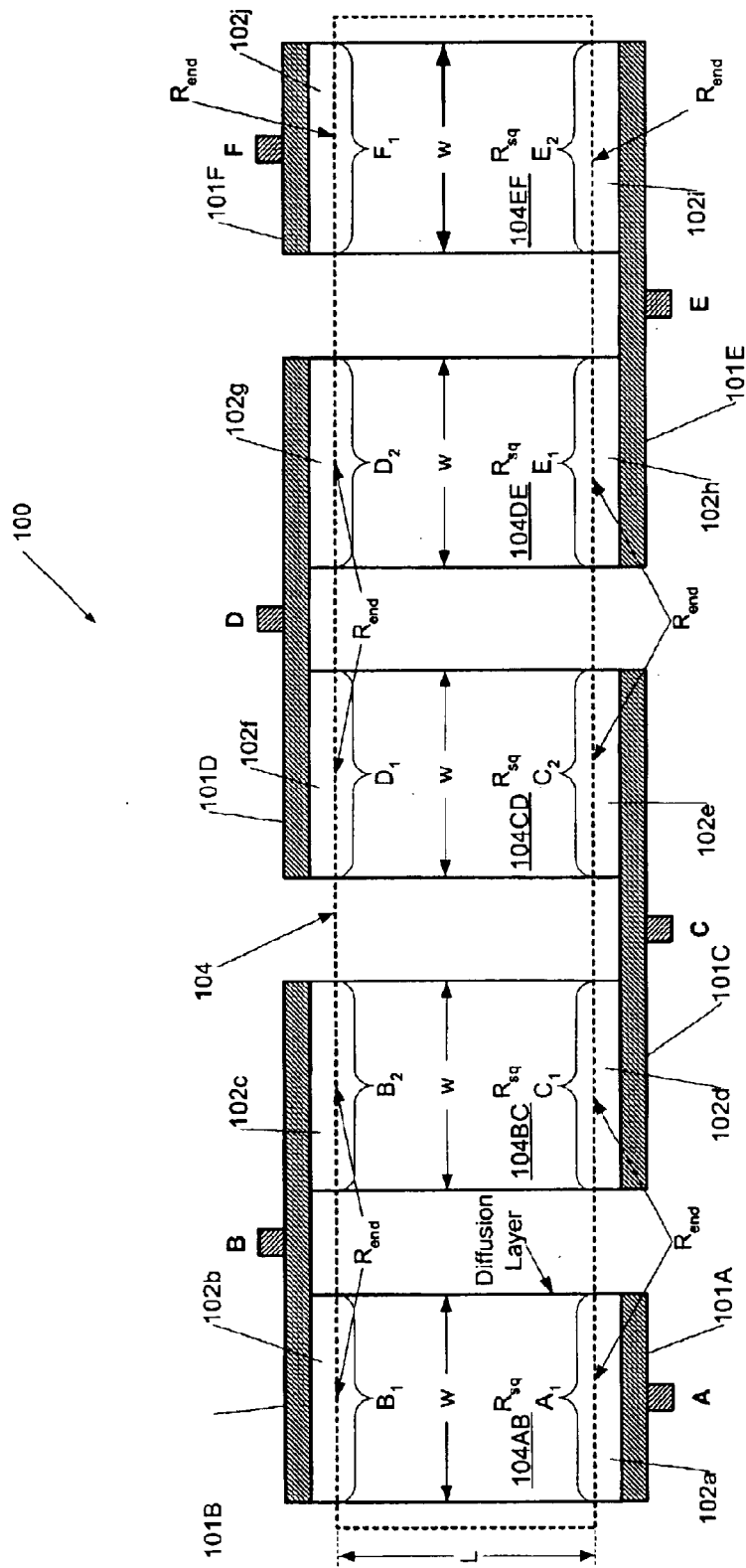
FIG. 1 (prior art) depicts a top view of a multi-tap programmable meandering resistor.

In one embodiment, a programmable resistor includes a variety of taps that provide external connections to the programmable resistor. Selection of any of a variety of tap combinations establishes a path through which current will flow, thus, setting the resistance value of the programmable resistor. In one embodiment, the programmable resistor minimizes the effects of parasitic end boundary resistances, $R_{end}/w$, between contacts and resistive areas by limiting the non-negligible contribution of the end boundary resistances to $2R_{end}/w$, regardless of the programmed tap combination, as opposed to conventional technology such as meander resistor 100 (FIG. 1) where parasitic resistance $R_{end}/w$ contributes approximately twice the amount of resistance relative to the primary resistive areas for every programmed tap combination. By fabricating a contiguous region of impedance material, only the $R_{end}/w$ end boundary resistances associated with selected taps affect the value of the programmed resistance. Reducing the relative contribution of $R_{end}/w$ to the overall value of the programmed resistance allows selection of smaller incremental resistance values, thus, providing a higher level of resistance granularity that improves resistance tuning and circuit performance.

In another embodiment, a notched tap structure provides predictability of the resistance value of each tap combination. Taps are narrowed to form a notch which establishes a well-defined current flow path, thus providing the resistance predictability. Additionally, notches also allow for a wider contact-resistive area end boundary, thus, further minimizing the parasitic effect of $R_{end}$.

Figure 2:
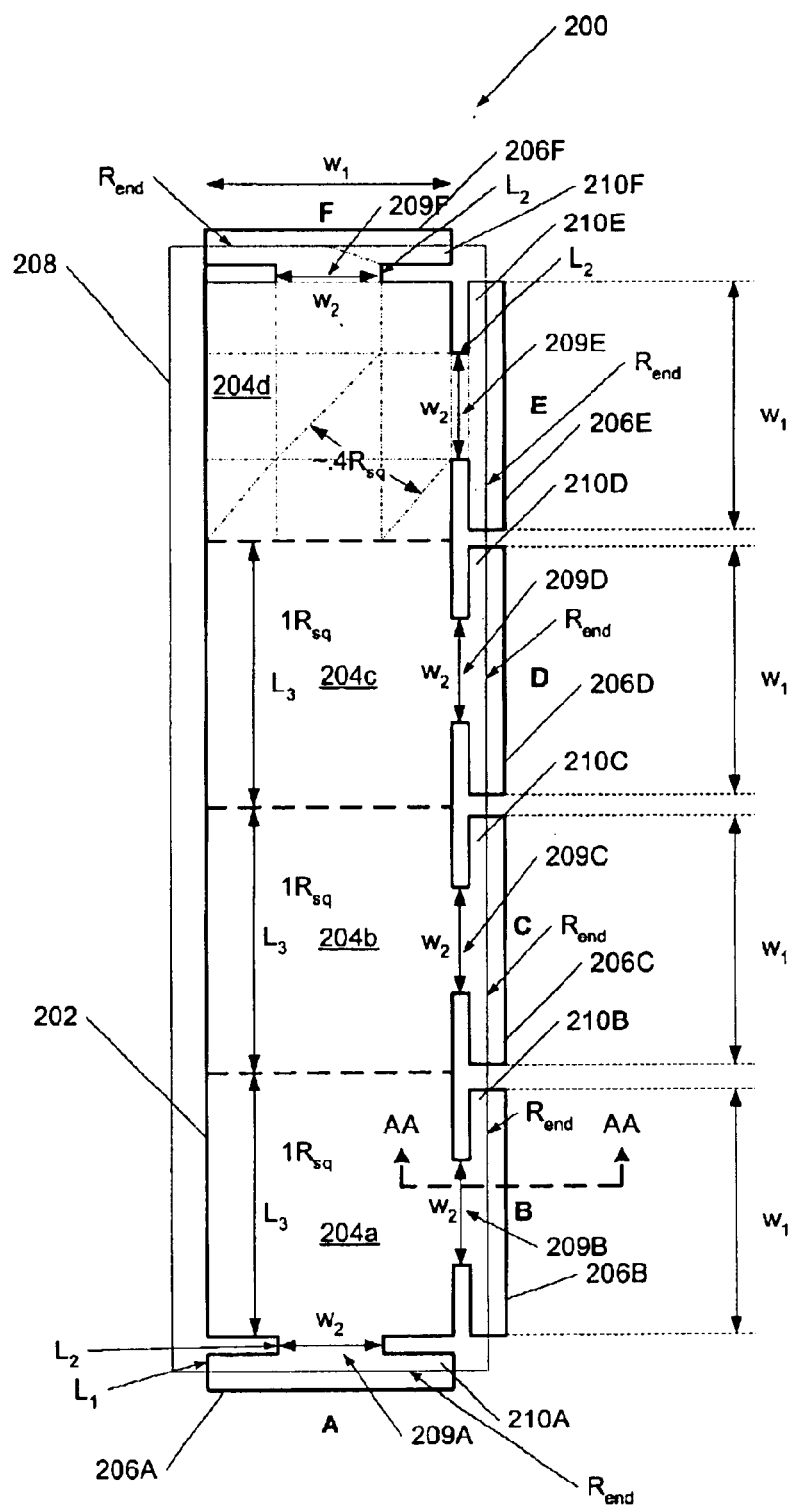
FIG. 2 depicts a top view of a multi-tap programmable resistor with minimal end boundary resistance.

FIG. 2 depicts a multi-tap programmable resistor 200 with minimal contact-resistive area end boundary parasitic resistance. The programmable resistor 200 has six taps A, B, C, D, E, and F, although programmable resistor 200 can be fabricated with any number of taps. Each of taps A–F couple to a contiguous resistive region 202, fabricated from a homogenous resistive material such as p+ diffusion material or non-salicide polysilicon resistor. A homogenous resistive material, which may have some variations due to factors such as fabrication limitations or intentional introduction of some material variations, provides a relatively predictable resistance per unit area. The resistive region 202 is conceptually divided into four resistance regions 204a, 204b, 204c, and 204d, each having a resistance of $R_{sq} \cdot (L_3/w_1)$. "$R_{sq}$" represents the unit area resistance of resistance regions 204a–204d. The four resistance regions 204a–204d each have square, top-view dimensions of length "$L_3$" and width "$w_1$" to facilitate resistance predictability, although any layout dimensions and shapes can be used and regions need not have identical dimensions.

Taps A–F are notched to provide current path predictability, and thus resistance predictability, while minimizing end boundary resistance. Taps A–F include corresponding notches 209A, 209B, 209C, 209D, 209E, and 209F, each having length "$L_2$" and width "$w_2$". Each notch 209X provides a well-defined current path to a corresponding selected tap, thus allowing predictability of overall programmable resistance. The end boundary dimension between a salicide contact and the resistive region 202 of tap perimeters 210A–210F increases relative to the width of notches 209A–209F to "$w_1$," for taps A–F. The respective salicide contacts (depicted in FIG. 4) for taps A–F reside below respective metal layers 206A–206F. A salicide deposition block layer 208 protects the resistive region 202 from a salicide formation process, and a subsequent fabrication process generally removes the salicide deposition block layer 208. As described above, each end boundary has a resistance value of $R_{end}/w_1$, and the value of $R_{end}/w_1$ is, thus, inversely proportional to the width of the end boundary. Thus, the notched taps A–F improve resistance predictability without increasing a comparable end boundary resistance value.

Figure 3:
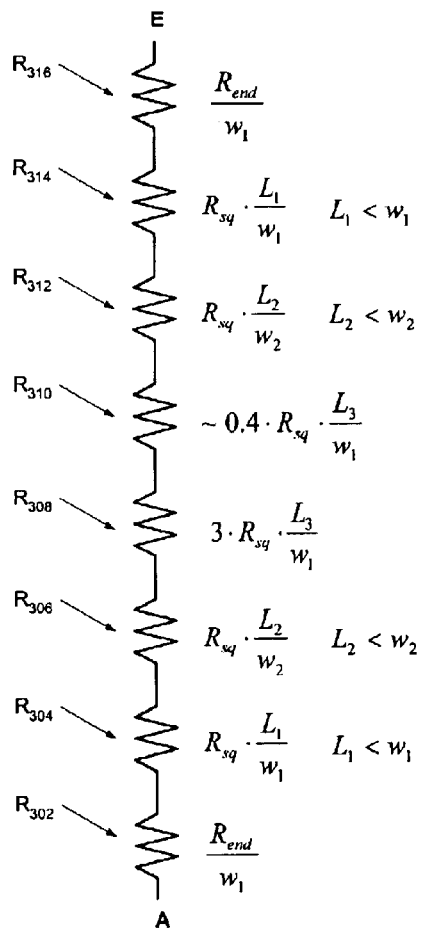
FIG. 3 depicts a schematic representation of one programmable resistor configuration of the programmable resistor of FIG. 2.

FIG. 3 depicts a schematic representation of programmable resistor 200 configured to conduct current between taps A and E. Eight series resistors 302–316 effectively model the resistance, $R_{AE}$, between taps A and E. Resistances 302–316 are defined in Table 1:

TABLE 1

| Resistor | Resistance Value | Resistor Description |
|---|---|---|
| $R_{302}$ | $R_{end}/w_1$ | Resistance at end boundary between salicide contact underlying metal layer 206A and perimeter resistive region 210A. |
| $R_{304}$ | $R_{sq} \cdot (L_1/w_1)$ | Resistance of tap perimeter 210A. |
| $R_{306}$ | $R_{sq} \cdot (L_2/w_2)$ | Resistance of notch 209A. |
| $R_{308}$ | $3 \cdot R_{sq} \cdot (L_3/w_1)$ | Resistance of resistance regions 204a, 204b, and 204c. |
| $R_{310}$ | $\sim 0.4 \cdot R_{sq} \cdot (L_3/w_1)$ | Resistance of current path in resistance region 204d. |
| $R_{312}$ | $R_{sq} \cdot (L_2/w_2)$ | Resistance of notch 209E. |
| $R_{314}$ | $R_{sq} \cdot (L_1/w_1)$ | Resistance of tap perimeter 210E. |
| $R_{316}$ | $R_{end}/w_1$ | Resistance at end boundary between salicide contact underlying metal layer 206E and perimeter resistive region 210E. |

As depicted in FIG. 3 and Table 1, only two parasitic end boundary resistances contribute to the value of programmable resistor $R_{A-B}$ or any configuration of programmable resistor 200.

Figure 4:
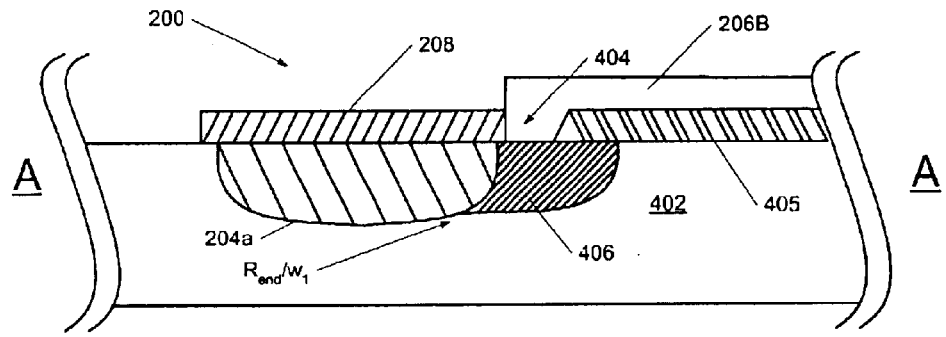
FIG. 4 depicts a cross-sectional view of the programmable resistor of FIG. 2.

FIG. 4 depicts cross-section A—A (from FIG. 2) of programmable resistor 200. In one embodiment, a standard complimentary metal oxide semiconductor ("CMOS") process is used to fabricate programmable resistor 200 in substrate 402. In one embodiment, substrate 402 is a silicon substrate. The parasitic end boundary resistance of $R_{end}/w_2$ occurs at the boundary of resistance region 204a and salicide contact 404. Salicide deposition block layer 208 substantially prevents the formation of salicide in the resistance region 204a, and a subsequent fabrication process generally removes the salicide deposition block layer. The fabrication process creates an opening 404 in insulation layer 405 to expose salicide contact 406. Metal layer 206B is disposed over insulation layer 405 and extends through opening 404 to contact salicide contact 406.

Figure 5:
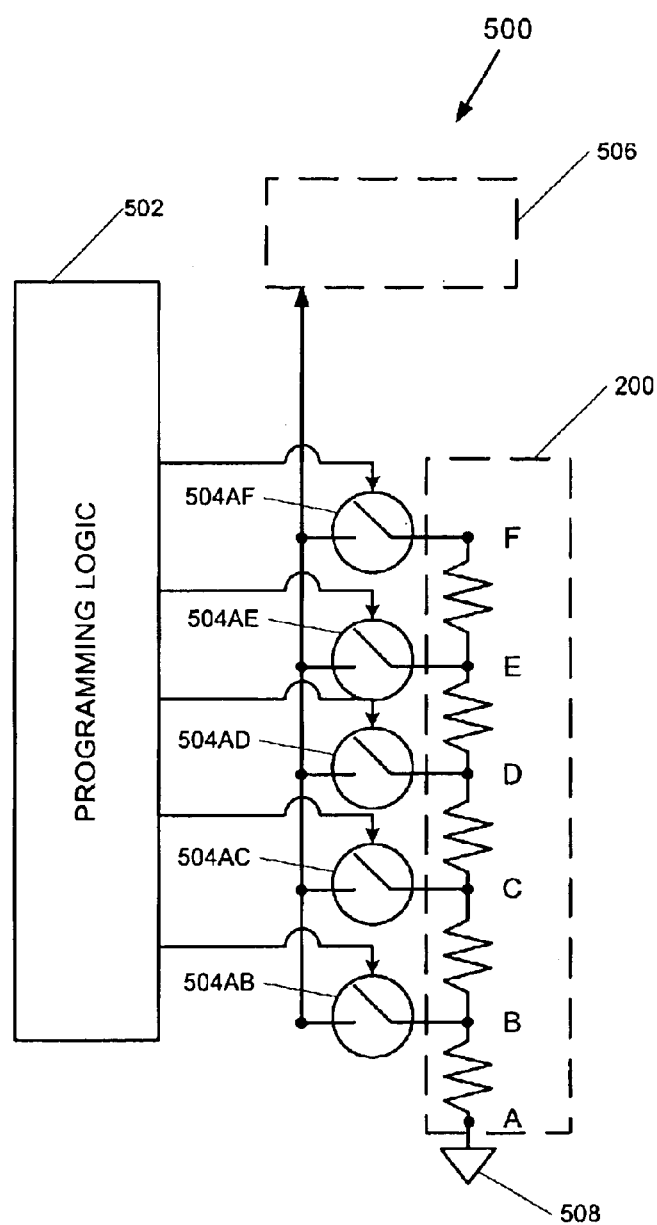
FIG. 5 depicts an integrated circuit and programming circuit for the programmable resistor of FIG. 2.

FIG. 5 depicts an integrated circuit that includes programming logic 502 to program the value of programmable resistor 200. Programming logic 502 uses soft or hard-coded programming instructions to select one of switches 504AB, 504AC, 504AD, 504AE, or 504AF. Each switch 504xx is, for example, a metal oxide semiconductor field effect transistor ("MOSFET"). If selected, the selected switch 504xx conducts and selects a resistance having a value corresponding to the resistance between tap A and the tap corresponding to the selected switch 504xx. For example, selection of switch 504AE selects a resistance between tap A and tap E, selection of switch 504AC selects a resistance between tap A and tap C, and so forth. FIG. 5 depicts programmable resistor 200 coupled between device 506 and a reference voltage 508. The programmable resistor 200 can be used to provide programmable resistance in virtually limitless circuit configurations.

Although the present invention has been described in detail, it should be understood that various changes, substitutions, and alterations can be made hereto without departing from the spirit and scope of the invention as defined by the appended claims. For example, materials other than those described herein can be used to fabricate programmable resistor 200. Additionally, it will be recognized by those of ordinary skill in the art that dimensions and ratios of dimensions can be varied to accommodate, for example, layout constraints, desired resistance values, and other design choices. Other embodiments of programming logic 502 allow selection of any combination of taps.

What is claimed is:

1. An apparatus having a programmable impedance, the apparatus comprising:

an electrical current impedance material; and multiple selectable connections to the impedance material, wherein an end boundary impedance is associated with a boundary between each connection and the impedance material and only the end boundary impedances associated with selected connections contribute a non-negligible impedance to a programmed impedance value of the programmable impedance for any programmable impedance value that equals the approximate sum of at least two possible impedance selections.

2. The apparatus of claim 1 wherein the impedance material is a contiguous resistive material.

3. The apparatus of claim 1 further comprising:

control logic coupled to each connection to select the programmed impedance value of the programmable impedance by selecting a conduction path with two of the connections.

4. The apparatus of claim 1 wherein the programmable impedance is a programmable resistor.

5. The apparatus of claim 1 wherein only two end boundary impedances contribute to the programmed impedance value of the programmable impedance for any programmable combination of impedances.

6. The apparatus of claim 1 wherein the impedance material is p+ diffusion material in a silicon based substrate and each connection comprises a salicide region.

7. The apparatus of claim 1 wherein the impedance material is non-salicide polysilicon material in a silicon based substrate and each connection comprises a salicide region.

8. The apparatus of claim 1 wherein each connection comprises a notched tap structure.

9. The apparatus of claim 8 wherein the ith notched tap structure includes a perimeter region of length $L_{1i}$ and width $W_{1i}$ and a neck region of length $L_{2k}$ and width $W_{2k}$, wherein $L_{1i} < W_{1i}$, $L_{2i} < W_{2i}$, and $W_{1i} < W_{2i}$, and an end boundary impedance is based in part on $L_{1i}$ and $W_{1i}$, and $0 \leq i \leq N-1$ and N equals the number of connections.

10. The apparatus of claim 1 further comprising a plurality of programmable impedances each comprising:

an electrical current impedance material; and multiple selectable connections to the impedance material, wherein an end boundary impedance is associated with a boundary between each connection and the impedance material and only the end boundary impedances associated with selected connections contribute a non-negligible impedance to a programmed impedance value of the programmable impedance for any programmable impedance value that equals the approximate sum of at least two possible impedance selections.

11. The apparatus of claim 1 wherein the programmable resistor is programmed by selecting a combination of any two of the selectable connections.

12. An integrated circuit having a programmable resistor, the integrated circuit comprising:

a homogenous resistive material; and at least three selectable connections to the resistive material, wherein an end boundary resistance is associated with a boundary between each connection and the resistive material and only the end boundary resistances associated with selected connections contribute to programmed resistance value of the programmable resistor.

13. The integrated circuit claim 12 further comprising:

control logic coupled to each connection to select the programmed impedance value of the programmable impedance by selecting a conduction path with two of the connections.

14. The integrated circuit claim 12 wherein only two end boundary resistances contribute to the programmed impedance value of the programmable impedance for any programmable combination of resistances.

15. The integrated circuit claim 12 wherein the impedance material is p+ diffusion material in a silicon based substrate and each connection comprises a salicide region.

16. The integrated circuit claim 12 wherein each connection comprises a notched tap structure.

17. The integrated circuit claim 12 wherein the programmable resistor is programmed by selecting a combination of any two of the selectable connections.

18. A method comprising:

selecting a first combination of selectable connections of a programmable electrical current impedance material, wherein an end boundary impedance is associated with a boundary between each connection and the impedance material and only the end boundary impedances associated with selected connections contribute a non-negligible impedance to a programmed impedance value of the programmable impedance for any programmable impedance value that equals the approximate sum of at least two possible impedance selections.

19. The method of claim 18 wherein the programmable impedance is a programmable resistor.

20. The method of claim 18 wherein only two end boundary impedances contribute to the programmed impedance value of the programmable impedance for any programmable combination of impedances.

21. The method of claim 18 wherein the impedance material is p+ diffusion material in a silicon based substrate and each connection comprises a salicide region.

22. The method of claim 18 wherein the impedance material is non-salicide polysilicon material in a silicon based substrate and each connection comprises a salicide region.

23. The method of claim 18 wherein each connection comprises a notched tap structure.

24. The method of claim 23 wherein the ith notched tap structure includes a perimeter region of length $L_{1i}$ and width $W_{1i}$ and a neck region of length $L_{2k}$ and width $W_{2k}$, wherein $L_{1i} < W_{1i}$, $L_{2i} < W_{2i}$, and $W_{1i} < W_{2i}$, and an end boundary impedance is based in part on $L_{1i}$ and $W_{1i}$, and $0 \leq i \leq N-1$ and N equals the number of connections.

25. A method comprising:
selecting a first combination of multiple selectable connections of a programmable electrical current impedance material, wherein an end boundary impedance is associated with a boundary between each connection and the impedance material and only the end boundary impedances associated with selected connections contribute a non-negligible impedance to a programmed impedance value of the programmable impedance for at least two programmable combinations of impedances having a selectable connection in common.

26. The method of claim 25 wherein each connection comprises a notched tap structure.

27. The method of claim 26 wherein the ith notched tap structure includes a perimeter region of length $L_{1i}$ and width $W_{1i}$ and a neck region of length $L_{2k}$ and width $W_{2k}$, wherein $L_{1i} < W_{1i}$, $L_{2i} < W_{2i}$, and $W_{1i} < W_{2i}$, and an end boundary impedance is based in part on $L_{1i}$ and $W_{1i}$, and $0 \leq i \leq N-1$ and N equals the number of connections.

28. An apparatus having a programmable impedance, the apparatus comprising:
an electrical current impedance material; and
multiple selectable connections to the impedance material, wherein an end boundary impedance is associated with a boundary between each connection and the impedance material and only the end boundary impedances associated with selected connections contribute a non-negligible impedance to a programmed impedance value of the programmable impedance for at least two programmable combinations of impedances having a selectable connection in common.

29. The apparatus of claim 28 wherein the impedance material is a homogenous resistive material.

30. The apparatus of claim 28 further comprising:
control logic coupled to each connection to select the programmed impedance value of the programmable impedance by selecting a conduction path with two of the connections.

31. The apparatus of claim 28 wherein the programmable impedance is a programmable resistor.

32. The apparatus of claim 28 wherein only two end boundary impedances contribute to the programmed impedance value of the programmable impedance for any programmable combination of impedances.

33. The apparatus of claim 28 wherein the impedance material is p+ diffusion material in a silicon based substrate and each connection comprises a salicide region.

34. The apparatus of claim 28 wherein the impedance material is non-salicide polysilicon material in a silicon based substrate and each connection comprises a salicide region.

35. The apparatus of claim 28 wherein each connection comprises a notched tap structure.

36. The apparatus of claim 35 wherein the ith notched tap structure includes a perimeter region of length $L_{1i}$ and width $W_{1i}$ and a neck region of length $L_{2k}$ and width $W_{2k}$, wherein $L_{1i} < W_{1i}$, $L_{2i} < W_{2i}$, and $W_{1i} < W_{2i}$, and an end boundary impedance is based in part on $L_{1i}$ and $W_{1i}$, and $0 \leq i \leq N-1$ and N equals the number of connections.

37. The apparatus of claim 28 further comprising a plurality of programmable impedances each comprising:
an electrical current impedance material; and
multiple selectable connections to the impedance material, wherein an end boundary impedance is associated with a boundary between each connection and the impedance material and only the end boundary impedances associated with selected connections contribute a non-negligible impedance to a programmed impedance value of the programmable impedance for at least two programmable combinations of impedances having a selectable connection in common.

38. The apparatus of claim 28 wherein the programmable resistor is programmed by selecting a combination of any two of the selectable connections.

39. A method comprising:
selecting a combination of selectable connections of a programmable electrical current impedance material, wherein at least three selectable connections are to a homogenous resistive material, wherein an end boundary resistance is associated with a boundary between each connection and the resistive material and only the end boundary resistances associated with selected connections contribute to programmed resistance value of the programmable resistor.

40. An apparatus having a programmable impedance, the apparatus comprising:
an electrical current impedance material; and
multiple selectable connections to the impedance material, wherein an end boundary impedance is associated with a boundary between each connection and the impedance material and only the end boundary impedances associated with selected connections contribute a non-negligible impedance to a programmed impedance value of the programmable impedance for at least two programmable combinations of impedances, wherein each connection comprises a notched tap structure.

41. The apparatus of claim 40 wherein the ith notched tap structure includes a perimeter region of length $L_{1i}$ and width $W_{1i}$ and a neck region of length $L_{2k}$ and width $W_{2k}$, wherein $L_{1i} < W_{1i}$, $L_{2i} < W_{2i}$, and $W_{1i} < W_{2i}$, and an end boundary impedance is based in part on $L_{1i}$ and $W_{1i}$, and $0 \leq i \leq N-1$ and N equals the number of connections.

42. An integrated circuit having a programmable resistor, the integrated circuit comprising:
a homogenous resistive material; and
at least three selectable connections to the resistive material, wherein an end boundary resistance is associated with a boundary between each connection and the resistive material and only the end boundary resistances associated with selected connections contribute to programmed resistance value of the programmable resistor, wherein each connection comprises a notched tap structure.

43. The integrated circuit of claim 42, wherein the ith notched tap structure includes a perimeter region of length $L_{1i}$ and width $W_{1i}$ and a neck region of length $L_{2k}$ and width $W_{2k}$, wherein $L_{1i} < W_{1i}$, $L_{2i} < W_{2i}$, and $W_{1i} < W_{2i}$, and an end boundary impedance is based in part on $L_{1i}$ and $W_{1i}$, and $0 \leq i \leq N-1$ and N equals the number of connections.

44. The integrated circuit of claim 12 wherein an end boundary resistance is associated with a boundary between each connection and the impedance material and only the end boundary resistances associated with selected connections contribute a non-negligible resistance to a programmed resistance value of the programmable resistance for-any programmable resistance value that equals the approximate sum of at least two possible resistance selections.

* * * * *